United States Patent
Qawami et al.

(10) Patent No.: US 10,056,139 B2
(45) Date of Patent: Aug. 21, 2018

(54) MANAGING THRESHOLD VOLTAGE SHIFT IN NONVOLATILE MEMORY

(71) Applicant: Intel Corporation, Santa Clara, CA (US)

(72) Inventors: Shekoufeh Qawami, El Dorado Hills, CA (US); Rajesh Sundaram, Folsom, CA (US); Prashant S. Damle, Santa Clara, CA (US); Doyle Rivers, El Dorado Hills, CA (US); Julie M. Walker, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/645,990

(22) Filed: Jul. 10, 2017

(65) Prior Publication Data

US 2017/0372780 A1    Dec. 28, 2017

Related U.S. Application Data

(63) Continuation of application No. 15/089,507, filed on Apr. 2, 2016, now Pat. No. 9,721,657.

(51) Int. Cl.
*G11C 11/00* (2006.01)
*G11C 13/00* (2006.01)
*G06F 13/16* (2006.01)

(52) U.S. Cl.
CPC ...... *G11C 13/0033* (2013.01); *G06F 13/1668* (2013.01); *G11C 13/0004* (2013.01); *G11C 13/004* (2013.01); *G11C 13/0069* (2013.01)

(58) Field of Classification Search
CPC ...... G11C 16/26; G11C 16/3418; G11C 29/02
See application file for complete search history.

(56) References Cited

U.S. PATENT DOCUMENTS

| | | | |
|---|---|---|---|
| 8,000,141 B1 | 8/2011 | Shalvi et al. | |
| 9,721,657 B1 * | 8/2017 | Qawami | G11C 13/0033 |
| 2008/0219057 A1 * | 9/2008 | Li | G06F 12/0804 |
| | | | 365/185.22 |
| 2008/0219059 A1 * | 9/2008 | Li | G11C 11/5628 |
| | | | 365/185.29 |
| 2012/0320670 A1 * | 12/2012 | Kau | G11C 8/10 |
| | | | 365/163 |
| 2015/0205664 A1 * | 7/2015 | Janik | G06F 11/1012 |
| | | | 714/764 |
| 2015/0301885 A1 * | 10/2015 | Yuan | G06F 11/1004 |
| | | | 714/807 |

FOREIGN PATENT DOCUMENTS

| EP | 2765578 A1 | 8/2014 |
|---|---|---|
| WO | WO 2013/166200 A1 | 11/2013 |

* cited by examiner

*Primary Examiner* — Tuan T Nguyen
(74) *Attorney, Agent, or Firm* — Thorpe North & Western, LLP

(57) ABSTRACT

Apparatus, systems, and methods to correct for threshold voltage drift in non-volatile memory devices are disclosed and described. In one example, a compensated demarcation voltage is generated by either a time-based drift compensation scheme or a disturb-based drift compensation scheme, and read and write operations to the non-volatile memory are carried out using the compensated voltage threshold.

19 Claims, 4 Drawing Sheets

MANAGING THRESHOLD VOLTAGE SHIFT IN NONVOLATILE MEMORY

PRIORITY DATA

This application is a continuation of U.S. patent application Ser. No. 15/089,507 filed Apr. 2, 2016, which is incorporated herein by reference.

BACKGROUND

Memory structures are integrated elements that provide data storage to a variety of electronics devices. Memory can include volatile memory structures that lose stored information when not powered (e.g., Dynamic Random Access Memory (DRAM)) or non-volatile memory (NVM) structures that retain stored information in the absence of power. Examples of types of NVM can include NAND flash memory, NOR flash memory, magnetoresistive RAM (MRAM), and phase change memory (PCM), among others.

BRIEF DESCRIPTION OF THE DRAWINGS

Features and advantages of various embodiments will be apparent from the detailed description which follows, taken in conjunction with the accompanying drawings wherein.

DESCRIPTION OF EMBODIMENTS

Figure 1:
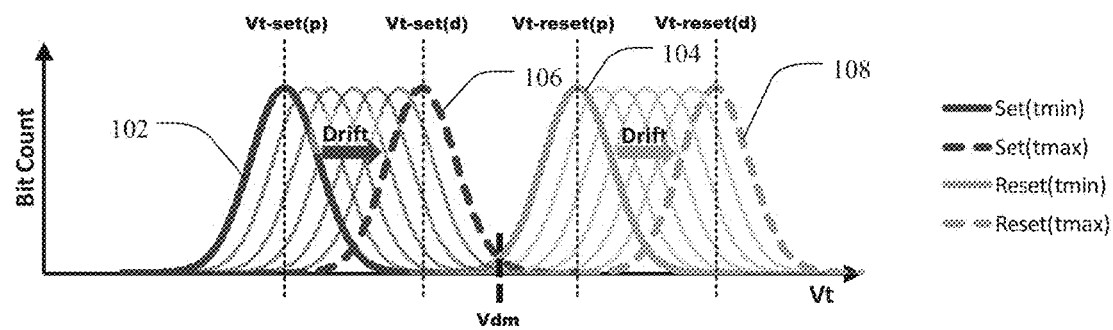
FIG. 1 is a graphical representation of simulated data.

Before the disclosed embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used to describe particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various embodiments. One skilled in the relevant art will recognize, however, that such detailed embodiments do not limit the overall concepts articulated herein, but are merely representative thereof.

As used in this written description, the singular forms "a," "an" and "the" include support for plural referents unless the context clearly dictates otherwise. Thus, for example, reference to "a bit line" includes support for a plurality of such bit lines.

As used herein, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies both to the form and function of individual components in a device or process, as well as to such devices or processes as a whole.

As used herein, "coupled" refers to a relationship of physical or electrical connection or attachment between one item and another item, and includes relationships of either direct or indirect connection or attachment. Any number of items can be coupled, such as materials, components, structures, layers, devices, objects, etc.

As used herein, "directly coupled" refers to a relationship of physical or electrical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "controller" refers to any circuit, electronic component, or device, that controls communications to and from memory. Such can include memory controllers, integrated memory controllers, controller hubs, chipsets, microcontrollers, and the like.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

When used in connection with a numerical value, the term "about" is used to provide the flexibility of "a little above" or "a little below" the specific value. However, it is to be understood that such recitation in this written description in connection also provides support for the exact numerical value recited.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Well-known methods, procedures, components, and circuits have not been described in detail so as not to obscure the particular examples. Further, various aspects of examples may be realized using various design implementations, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Example Embodiments

An initial overview of embodiments is provided below and specific embodiments are then described in further detail. This initial summary is intended to aid readers in understanding the embodiments more quickly, but is not intended to identify key or essential technological features, nor is it intended to limit the scope of the claimed subject matter.

Many types of non-volatile memory (NVM) utilize the measurement of threshold voltage (Vt) as a mechanism for identifying the bit state of memory cells. Non-limiting examples of such NVM technologies can include NAND flash memory, three dimensional (3D) cross-point memory, spin-transfer torque random access memory (STT-RAM), magneto-resistive random access memory (MRAM), write in place non-volatile MRAM, phase change memory (PCM), and the like. In PCM, for example, Vt is correlated with the lattice structure of the phase change material in a given memory cell. In one example, the binary lattice configurations of crystalline and amorphous are utilized to store information bits. However, additional intermediate lattice states are possible and may extend the bit storage capacity of a single PCM cell. The use of phase change materials as a memory medium is dependent on the phenomenon of "threshold shifting". While "threshold shifting is a phenomenon that is applicable to most if not all NVM, much of the present discussion is directed to PCM-type devices. This is merely for the sake of convenience, and it should be understood that other applicable NVM technologies are considered to be within the present scope.

A typical phase change material in an amorphous state has such a high resistance that extremely high voltages would be required to deliver sufficient current to heat the material above the crystallization temperature. When a voltage above a Vt is applied across such an amorphous material, however, the electrical resistance is abruptly decreased, and the amorphous material becomes electrically conductive. Under these electrically conductive conditions, the phase change material can be rapidly heated and melted by the sudden current flow. The Vt thus represents a threshold at which a phase change material undergoes a shift in electrical conductivity from a high resistance to a low resistance state. If the current is abruptly switched off after melting, the phase change material will return to the amorphous state, and the Vt will recover slowly over time toward the pre-threshold shift value. The amorphous state is referred to as the "reset" state, and generally corresponds to a bit state of 0. If the material is heated to a temperature between the crystallization temperature (or glass transition temperature) and the melting point temperature for that material, and then maintained at the temperature (or within this range) for a sufficient time, the phase change material will crystallize and subsequently cool in this conductive state. The crystalline state is referred to as the "set" state, and generally corresponds to a bit state of 1.

This threshold switching transition from the low-voltage/high-resistive state to the high-voltage/low-resistive state occurs very rapidly, on the order of a few picoseconds, for example. The voltage change across the device, however, is much slower, on the order of a few nanoseconds, for example. As a result, a transient current (i.e. snap back current) flows in the device as a result of this potential difference, which in some examples can be utilized to read the bit state of a given PCM cell or other device or material having phase change properties. For example, the PCM cell bit state can be determined by applying a demarcation bias (Vdm) across the cell. If a snap back current is generated (i.e. the PCM cell "snaps"), then Vdm is above Vt. More specifically, if the voltage of Vdm is set to be in between the expected Vt of the set state and the expected Vt of the reset state, then the presence of a snap back current would indicate that the memory cell being read has a Vt below Vdm, and is in the set state. On the other hand, the absence of a snap back current would indicate that the memory cell being read has a Vt above Vdm, and is in the reset state.

One challenge that can arise, however, is the drift of Vt, which refers to the tendency of a phase change material to shift or drift over time from its programmed value. This drift effect can occur due to a variety of factors. For example, drift can occur as a result of read disturbances due to the number of times a read operation has been performed on the cell, or in some cases neighboring cells. Drift can also occur merely due to the passage of time, as well as a combination of read disturbances and time passage. For example, FIG. 1 shows a graph of a distribution of set cell Vts 102 (or set(tmin)) and a distribution of reset cell Vts 104 (or reset(tmin)) along a Vt axis. Vt-set(p) and Vt-reset(p) represent Vt of the center of the set cell 102 and reset cell 104 distributions, respectively, at the time of programming. These distributions tend to drift, either due to the time lapse from programming, memory cell use, or both, which is shown by the respective shifts in the distributions to the right and toward the set(tmax) distribution of set cells 106 and the reset(tmax) distribution of reset cells 108. Vt-set(d) and Vt-reset(d) represent Vt of the center of the set cell 106 and reset cell 108 distributions, respectively, following a period of drift. Thus, to determine the bit states of the associated memory cells, a Vdm is applied at a point between the two distributions, as has been described above. Near the time of programming, an unambiguous determination of bit state can be obtained. The drifting of the Vt distributions, however, including the distribution as a whole as well as individual or small groups of memory cells, can cause a distribution or a portion of a distribution to drift far enough to cause read errors. For example, when the Vts of set memory cells drift to a Vt that is greater than Vdm, these set cells will be read as reset cells due to the associated Vts being greater than the Vdm. It is noted that, due to the differential use of individual memory cells across the distribution, some cells may drift faster than other cells.

In one example embodiment, the shift in Vt can be corrected for by generating a compensated Vdm that accounts for the Vt drift, and sending the compensated Vdm through the command address or other bus as part of the command sequence for read and write operations, in some cases for each read and write operation. In some examples, the compensated Vdm can be calculated in real time, while in other examples the compensated Vdm can be picked from a pre-generated lookup table. Furthermore, it is contemplated that the compensated Vdm can be set or that a lookup table of Vdm values can be programmed during manufacture. In other examples, the compensated Vdm can be calculated or otherwise generated during use.

Figure 2:
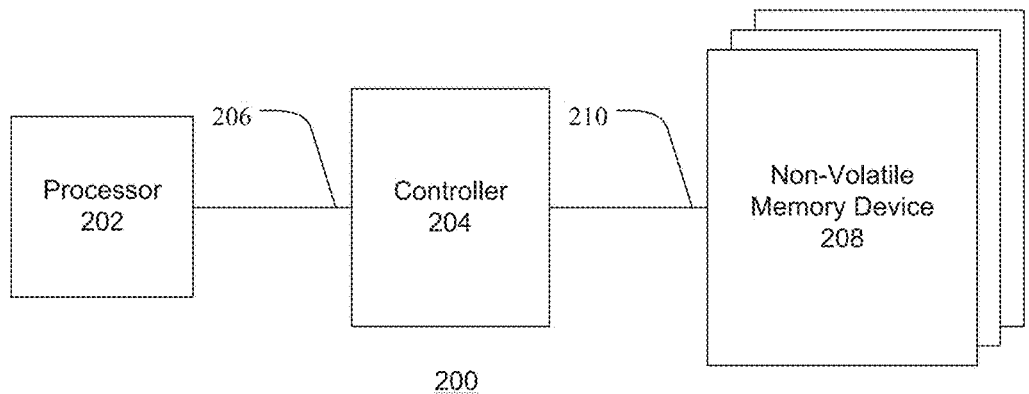
FIG. 2 is a block diagram of a computing system.

Various devices, systems, and methods are provided as example implementations. FIG. 2 shows a high-level block diagram of selected aspects of an example embodiment of an electronic device or system. Such a device or system 200 includes a processor (or processors) 202, a controller 204, an interconnect 206 coupling the processor 202 to the controller 204, a memory device (or devices) 208, and a bus 210. As FIG. 2 is a high-level illustration, the bus 210 can be a system bus (or internal bus) or a communication bus (or external bus), depending on the nature and location of the memory device 208. For example, in one embodiment, the memory device 208 can be system memory, and thus the bus 210 can be an internal bus. In another example, the memory device 208 can be a remote memory device such as a storage device, and as such, the bus 210 can be an external bus. In yet another example, the memory device 208 can represent both a system memory device and a remote memory device, and thus the bus 210 can represent an internal bus and an external bus.

Similarly, the nature of the interconnect 206 can vary, depending on the nature and design of the system. In some examples, the interconnect 206 can be a system bus (or internal bus) that couples the processor 202 to a separate controller 204. In other examples, the controller 204 can be an integrated memory controller, and thus is integrated with the processor 202 (or a CPU package). In such cases, the interconnect 206 can represent internal circuitry of the processor or CPU package. The processor 202 can be any number of processors, and can be a central processing unit, an embedded processor, a partitioned processor, a multicore processor, or the like. In some examples, controller 204 is implemented in a separate circuit or package as that of processor 202.

As has been described, a compensated Vdm value or similar instruction can be incorporated into the command sequence for read and write operations in order to account for Vt drift. In general, drift compensation circuitry refers to any circuit, processor, process, code, logic, lookup table, or the like, that is involved in the calculation, retrieval, or delivery of a compensated Vdm or Vdm value. The drift compensation circuitry can be physically located anywhere in a computing or other electronic system, such as, for example, a central processing unit or other main processor, a controller, a memory controller, including integrated memory controllers, a controller hub, a memory device, such as circuitry in a remote memory storage device, circuitry in a Dual In-line Memory Module (DIMM), and the like, a controller hub, or any other memory-related structure, including any possible combination thereof.

Figures 3A, 3B:
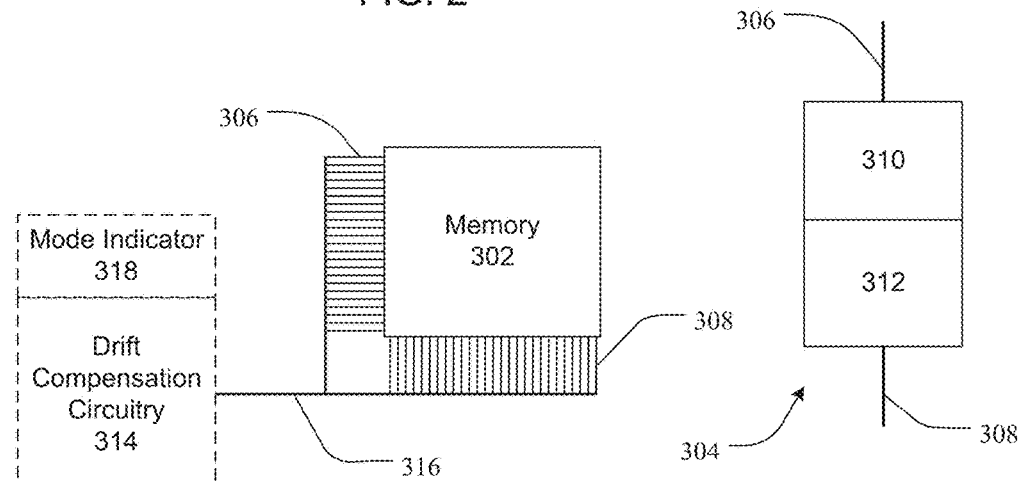
FIG. 3a is a block diagram of a non-volatile memory device.
FIG. 3b is a block diagram of a phase change memory cell.

FIGS. 3*a*-*b* are simplified block diagrams that show an example embodiment of an electronic device or system, comprising a memory 302 made up of, for example, an array of PCM cells 304 addressed by an array of word lines (WLs) 306 and an array of bit lines (BLs) 308. As is shown in FIG. 3*b*, one example of a PCM cell 304 comprises a select device (SD) 310 and a phase change material (PM) 312 coupled to the SD, where the PM has a program state. In one embodiment, the program state can be either crystalline (set) or amorphous (reset), although intermediate program states are contemplated. Additionally, while a WL 306 is shown coupled to the SD 310 and a BL 308 is shown coupled to the PM 312, in some embodiments this coupling arrangement can be switched.

The electronic device or system also comprises drift compensation circuitry 314 coupled to the memory 302 by a bus 316. As described above, the bus 316 can be an internal bus or an external bus, depending on the nature of the memory 302. The drift compensation circuitry 314 is generally configured to correct for drift of Vt by generating or otherwise providing a compensated Vdm that accounts for the Vt drift, and in some examples send the compensated Vdm as part of the command sequence for read and/or write operations. The drift compensation circuitry 314 is represented generally as coupled to the memory 302 by the bus 316, which can vary depending on the memory and electronic device configuration.

As has been described above, Vt drift can result from read disturbances (or disturbs), as well as the mere passage of time. Memory cells that are read more often, for example, can drift more quickly than memory cells that are read less often. While in some embodiments, a memory device can be set to follow a time-based, a disturbance-based (i.e. disturb-based), or an intermediate drift compensation scheme based on a beforehand knowledge of the potential use of a given memory device, in some embodiments a time- or disturb-based decision can be made to reflect the actual usage of the memory device. While various implementations are contemplated, in one embodiment, the drift mode compensation circuitry 314 can include a mode indicator 318 to indicate the current time- or disturb-based operation mode, although the mode indicator need not be physically located in, at, or near the drift compensation circuitry 314. Furthermore, while the mode indicator can be a memory device-wide indicator, in some embodiments the mode indicator 318 can be implemented at the level of the memory bank, the memory page, the cache line, or even the memory cell. At the memory cell-level, for example, time and usage history can be used to more accurately compensate for Vt drift given the often disparate usage characteristics of individual memory cells. In one embodiment, the mode indicator can be a mode bit in a memory location, such as, for example, a bit location in the memory device, or a bit location in a second memory, such as an NVM at the controller. In other embodiments, the mode indicator can be a dedicated memory or circuit.

Figures 4A, 4B, 4C:
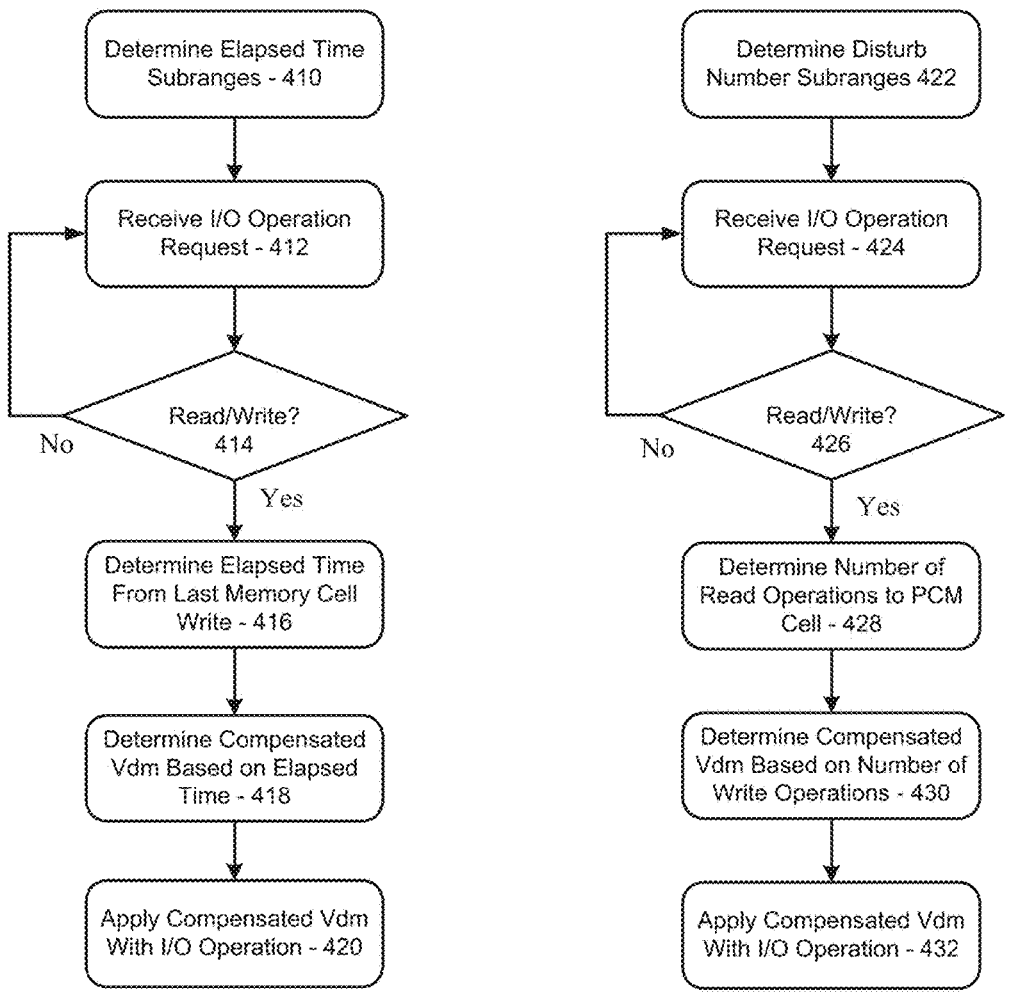
FIG. 4a is a diagram of example method steps.
FIG. 4b is a diagram of example method steps.
FIG. 4c is a diagram of example method steps.

FIG. 4a, for example, shows a decision scheme based on usage of memory, whether it be for a memory device, a memory cell, or any memory increment in between. In one example embodiment, a selection method can include 402 determining the drift compensation mode. For example, the drift compensation mode can be either a time-based drift compensation mode or a disturb-based drift compensation mode, although intermediate time/disturb compensation modes and compensation modes based on drift-related disturbs other than the number of read cycles are also contemplated.

In one embodiment, the drift compensation mode can be read from the mode indicator 318. The drift compensation mode can be set to a given compensation mode in a number of ways. For example, the manufacturer of the memory, or the device or system incorporating the memory, can set the mode indicator during manufacture to either a time- or a disturb-based drift compensation mode. In another example, a distributor of a system or device having the memory incorporated therein can set the mode indicator. In yet another example, the mode indicator can be set, either by an end-user or by drift compensation circuitry in the device or system as a result of memory use. Additionally, in some examples, the mode that is set in the mode indicator is permanent, or at least not designed to be modified by an end-user. In other examples, the mode indicator is designed to allow modification of the set mode as the device is used.

In another embodiment, the drift compensation mode can be determined from the usage history of the memory cells at the memory location. For example, a disturb-based drift compensation mode can be chosen if the memory cell or cells at the memory location have experienced a number of read operations or other disturbs above a threshold number or numbers. If, for example, the number of read or disturb operations is below the threshold number, then the time-based drift compensation mode is used. Thus, the number of disturb operations can be tracked and compared against a threshold to determine if a disturb-based compensation mode is to be used to determine the compensated Vdm. While in some cases the disturb-based compensation mode can be based on the number of read disturbs experienced by a memory cell, in other cases the disturb-based compensation mode can be based on a number of disturbs, regardless of the nature or origin of the disturb. For example, in situations whereby a programming event (or write event) occurs in a PCM cell that is in close enough proximity to cause drift in a PCM cell being monitored, such can be counted as a disturb event.

Operation 404 thus determines whether or not a disturb-based drift compensation mode is used, either from the mode indicator or the memory usage history. If the determination is for the time-based drift compensation mode, control passes to operation 406, and the drift compensation circuitry 314 implements a time-based drift compensation algorithm that corrects for Vt drift based on the amount of time elapsed since the last write operation to the memory cell or memory cells of a memory location. If the determination is for the disturb-based drift compensation mode, control passes to operation 408, and the drift compensation circuitry 314 implements a disturb-based drift compensation algorithm that corrects for Vt drift based on the number of read operations or other disturbs since the last write operation to the memory cell or memory cells of a memory location.

In one example embodiment, a time-based drift compensation mode can include determining the compensated Vdm by any number of techniques. For example, in one embodiment, the amount of expected drift can be calculated or estimated directly from the elapsed time or number of disturb cycles, and then the expected drift can be added to a baseline Vdm to determine the compensated Vdm. The baseline Vdm can be the Vdm that would be expected in the absence of drift. In another example embodiment, the range of the time-based drift history and range of the disturb-based drift history can be divided into a plurality of subranges, where each subrange is correlated to a particular compensated Vdm (or potential compensated Vdm). For example, if the drift compensation circuitry 314 indicates that the time-based drift mode is to be used for a particular memory cell, a determination is made as to which time-based subrange corresponds to the memory cell, based on the amount of elapsed time since the last write operation to that cell. The compensated Vdm for that subrange would then be used to read the memory cell. Similarly, if the disturb-based drift mode is used, a determination is made as to which disturb-based subrange corresponds to the disturb history (number of disturbances) of the memory cell, and the compensated Vdm associated with that subrange is used to read the memory cell.

In some cases, the pluralities of subranges for the time- and disturb-based modes can be preconfigured by a manufacturer, a vendor, or the like. In other cases, the pluralities of subranges for the time- and disturb-based modes can be generated during use, including the initial establishment of subranges, writing over preconfigured subranges, writing over subranges previously established during use, and the like. The subranges can be overlapping or non-overlapping, and they can be of a uniform or non-uniform size. For example, if it is determined that the rate of drifting of a memory cell will accelerate over time, subranges that are more remote in time from the last write operation may be shorter in total duration compared to subranges closer in time to account for the acceleration of the rate of drift.

In one nonlimiting time-based drift mode example, the total potential elapsed time range can be divided into a set of four elapsed time subranges (El_Time1$_{MIN}$ . . . El_Time1$_{MAX}$, El_Time2$_{MIN}$ . . . El_Time2$_{MAX}$, El_Time3$_{MIN}$ . . . El_Time3$_{MAX}$, El_Time4$_{MIN}$ . . . El_Time4$_{MAX}$), where each subrange is associated with a compensated Vdm (i.e., Vdm1, Vdm2, Vdm3, and Vdm4). Any number of subranges and associated compensated Vdms can be utilized to account for memory cell drift. Upon receiving a read or a write operation request referenced to a memory location and/or a memory cell in a memory location, the drift compensation circuitry determines an elapsed time (or time elapsed) since the last write operation to the memory cell of the memory location, and then compares the elapsed time against the elapsed time subranges to select a matching subrange. The compensated Vdm associated with the matched subrange is thus used as the compensated Vdm to perform the read or write operation on the memory cell.

In one non-limiting example, the first time window (El_Time1$_{MIN}$ . . . El_Time1$_{MAX}$) can extend from 50 ns to 10 μs, the second time window (El_Time2$_{MIN}$ . . . El_Time2$_{MAX}$) can extend from 10 μs to 60 μs, the third time window (El_Time3$_{MIN}$ . . . El_Time3$_{MAX}$) can extend from 60 μs to 600 μs, and the fourth time window (El_Time4$_{MIN}$ . . . El_Time4$_{MAX}$) can extend from 600 μs to 3 ms. In another non-limiting example, the first time window (El_Time1$_{MIN}$ . . . El_Time1$_{MAX}$) can extend from 50 ns to 10 μs, the second time window (El_Time2$_{MIN}$ . . . El_Time2$_{MAX}$) can extend from 5 μs to 60 μs, the third time window (El_Time3$_{MIN}$ . . . El_Time3$_{MAX}$) can extend from 30 μs to 600 μs, and the fourth time window (El_Time4$_{MIN}$ . . . El_Time4$_{MAX}$) can extend from 300 μs to 3 ms. It should be understood that the values of the time windows can vary greatly, depending on the design and intended usage of the device, and can be tailored to suit a given device or device application. In some cases, for example, if memory cells of a device are expected to drift over a period of from microseconds or milliseconds to years or even decades, then the values of the subrange windows used can collectively range from milliseconds to years or decades to accommodate the full range of the drift, in an overlapping or non-overlapping manner. For overlapping ranges, the compensated Vdm can be selected by any of a number of techniques. For example, in one embodiment whereby an elapsed time falls in an overlapping portion of two ranges, the compensated Vdm associated with either of the subrange windows can be used. In another embodiment, an intermediate compensated Vdm (such as an average, for example) can be used for elapsed times falling within an overlapping region.

In some examples, the time values for the ranges of elapsed time can be expressed in scientific notation using EQ 1 to minimize the associated bit size:

$$\text{Elapsed Time}=[x]\cdot[y]e^{[a][z]} \quad \text{EQ 1}$$

[x],[y],[a], and [z] are further described in the non-limiting examples shown in Table 1.

TABLE 1

| | Time-Based Drift: |
|---|---|
| El_Time1 (min time) | Expressed as [x].[y]exp[a][z] seconds<br>[6:0] = value of [z]<br>[7] = value of [a] as a sign bit for [z], 1 > positive, 0 > negative<br>[11:8] = value of [y]<br>[15:12] = value of [x]<br>eg: 50 ns would be 5.0e$^{-8}$ sec, value would be 08 h (low byte) 50 h (hig h byte) |
| El_Time1 (max time) | Expressed as [x].[y]exp[a][z] seconds<br>[6:0] = value of [z]<br>[7] = value of [a] as a sign bit for [z], 1 > positive, 0 > negative<br>[11:8] = value of [y]<br>[15:12] = value of [x]<br>eg: 10 μs would be 1.0e$^{-5}$ sec, value would be 05 h (low byte) 10 h (high byte) |
| El_Time2 (min time) | Expressed as [x].[y]exp[a][z] seconds<br>[6:0] = value of [z]<br>[7] = value of [a] as a sign bit for [z], 1 > positive, 0 > negative<br>[11:8] = value of [y]<br>[15:12] = value of [x]<br>eg: 5 μs would be 5.0e$^{-6}$ sec, value would be 06 h (low byte) 50 h (high byte) |
| El_Time2 (max time) | Expressed as [x].[y]exp[a][z] seconds<br>[6:0] = value of [z]<br>[7] = value of [a] as a sign bit for [z], 1 > positive, 0 > negative<br>[11:8] = value of [y]<br>[15:12] = value of [x]<br>eg: 60 μs would be 6.0e$^{-5}$ sec, value would be 05 h (low byte) 60 h (high byte) |
| El_Time3 (min time) | Expressed as [x].[y]exp[a][z] seconds<br>[6:0] = value of [z]<br>[7] = value of [a] as a sign bit for [z], 1 > positive, 0 > negative |

TABLE 1-continued

Time-Based Drift:

| | |
|---|---|
| | [11:8] = value of [y]<br>[15:12] = value of [x]<br>eg: 30 μs would be 3.0e$^{-5}$ sec, value would be 05 h (low byte) 30 h (high byte) |
| El_Time3<br>(max time) | Expressed as [x].[y]exp[a][z] seconds<br>[6:0] = value of [z]<br>[7] = value of [a] as a sign bit for [z], 1 > positive, 0 > negative<br>[11:8] = value of [y]<br>[15:12] = value of [x]<br>eg: 600 μs would be 6.0e$^{-4}$ sec, value would be 04 h (low byte) 60 h (high byte) |
| El_Time4<br>(min time) | Expressed as [x].[y]exp[a][z] seconds<br>[6:0] = value of [z]<br>[7] = value of [a] as a sign bit for [z], 1 > positive, 0 > negative<br>[11:8] = value of [y]<br>[15:12] = value of [x]<br>eg: 300 μs or 3.0e$^{-4}$ sec, value would be 04 h(low byte) 30 h(high byte) |
| El_Time4<br>(max time) | Expressed as [x].[y]exp[a][z] seconds<br>[6:0] = value of [z]<br>[7] = value of [a] as a sign bit for [z], 1 > positive, 0 > negative<br>[11:8] = value of [y]<br>[15:12] = value of [x]<br>eg: 3 ms would be 3.0e$^{-3}$ sec, value would be 03 h (low byte) 30 h (high byte) |

Thus, for a 16-bit storage location, for example, the low byte (bits 0-7) stores the [z] value (bits 0-6) and the sign (bit 7) of the [z] value, and the high byte (bits 8-15) stores the [x] value (bits 12-15) and the [y] value (bits 8-11). The storage location can be any controller-accessible memory location capable of storing the elapsed time values. In one example, the storage location can be a memory register at the memory controller. In another example, the storage location can be at the NVM.

In one embodiment, as is shown in FIG. 4B, a time-based drift compensation scheme can include 410 determining or retrieving the elapsed time subranges, as described above. At operation 412, an input/output (I/O) request is received by the controller, and 414 a determination is made as to whether or not the I/O request is a read operation or a write operation. If the I/O request is not a read or a write operation, control is passed back to operation 412, and the controller waits to receive another I/O operation. If, however, the I/O request is a read or a write operation, control passes to 416 and the drift compensation circuitry 314 determines the amount of time that has elapsed since the last write operation to the memory cell associated with the physical address to which the read or write operation is directed, or in other words, since Vt was reset by a write operation. It is noted that, in some embodiments, 410 determining the elapsed time subranges can occur prior to operation 412 as shown, or during or following operation 412. Also, while in some embodiments the drift compensation circuitry 314 can determine the amount of time that has elapsed since the last write operation, in other embodiments the drift compensation circuitry 314 can determine the amount of time that has elapsed since the last read operation, or some combination of read/write operations.

At operation 418, the drift compensation circuitry 314 determines a compensated Vdm based, at least in part, on the amount of time that has elapsed since the last write operation to the memory cell associated with the physical address to which the read or write operation is directed. In some embodiments, the compensated Vdm can be determined by matching the elapsed time to one of the elapsed time subranges, and utilizing the compensated Vdm associated with the matched subrange. As an example referencing the subranges from Table 1, a memory cell with an elapsed time of 100 ns would fall within the 50 ns to 10 μs of the first subrange (El_Time1$_{MIN}$ . . . El_Time1$_{MAX}$). As such, the compensated Vdm associated with the first subrange would be used to read or write to the memory cell.

At operation 420, the controller performs the read or write operation on the memory cell associated with physical address to which the read or write operation is directed, using the compensated Vdm as the Vdm in order to distinguish between the set cells and the reset cells. For a read operation, the compensated Vdm has been shifted relative to the original Vdm to account for the drift of Vt. For a write operation, a programming pulse can be sent to the memory cell, where the programming pulse has a voltage that is higher than the compensated Vdm to ensure that the programming pulse causes a Vt shift and melts phase change material in the memory cell, which would reset the Vt of the memory cell to its program state value.

In one nonlimiting disturb-based drift mode example, the total potential elapsed time range can be divided into a set of four disturb number subranges (Dist#1$_{MIN}$ . . . Dist#1$_{MAX}$, Dist#2$_{MIN}$ . . . Dist#2$_{MAX}$, Dist#3$_{MIN}$ . . . Dist#3$_{MAX}$, Dist#4MIN . . . Dist#4$_{MAX}$), where each subrange is associated with a compensated Vdm (i.e., Vdm1, Vdm2, Vdm3, and Vdm4). Any number of subranges and associated compensated Vdms can be utilized to account for memory cell drift. Upon receiving a read or a write operation request referenced to a memory location and/or a memory cell in a memory location, the drift compensation circuitry determines the number of disturbs since the last write operation to the memory cell of the memory location, and then compares the number of distrubs against the disturb number subranges to select a matching subrange. The compensated Vdm associated with the matched subrange is thus used as the compensated Vdm to perform the read or write operation on the memory cell.

In one non-limiting example, the first disturb number subrange ($Dist\#1_{MIN} \ldots Dist\#1_{MAX}$) can extend from 0 to $1e^3$ disturbs, the second disturb number subrange ($Dist\#2_{MIN} \ldots Dist\#2_{MAX}$) can extend from $1e^3$ to $1e^4$ disturbs, the third disturb number subrange ($Dist\#3_{MIN} \ldots Dist\#3_{MAX}$) can extend from $1e^4$ to $1e^6$ disturbs, and the fourth disturb number subrange ($Dist\#4_{MIN} \ldots Dist\#4_{MAX}$) can extend from $1e^6$ to $1e^7$ disturbs. In another non-limiting example, the first disturb number subrange ($Dist\#1_{MIN} \ldots Dist\#1_{MAX}$) can extend from 0 to $1e^4$ disturbs, the second disturb number subrange ($Dist\#2_{MIN} \ldots Dist\#2_{MAX}$) can extend from $1e^a$ to $1e^4$ disturbs, the third disturb number subrange ($Dist\#3_{MIN} \ldots Dist\#3_{MAX}$) can extend from $1e^4$ to $1e^6$ disturbs, and the fourth disturb number subrange ($Dist\#4_{MIN} \ldots Dist\#4_{MAX}$) can extend from $1e^5$ to $1e^7$ disturbs. It should be understood that the values of the disturb number subranges can vary greatly, depending on the design and intended usage of the device, and can be tailored to suit a given device or device application. Thus, the subrange values can be spread out throughout the expected life of the device, in any number of subranges.

In some examples the number of disturbs used in the disturb number subranges may be expressed using the EQ 2:

$$\text{number of disturbs} = [y]e^{[z]} \quad \text{EQ 2}$$

Non-limiting examples are shown in Table 3.

TABLE 2

Disturb-Based VDM:

| | |
|---|---|
| Vdm1 (min disturb) | Expressed as [y]exp[z] [3:0] = value of [z], [7:4] = value of [y] |
| Vdm1 (max disturb) | Expressed as [y]exp[z] [3:0] = value of [z], [7:4] = value of [y] |
| Vdm2 (min disturb) | Expressed as [y]exp[z] [3:0] = value of [z], [7:4] = value of [y] |
| Vdm2 (max disturb) | Expressed as [y]exp[z] [3:0] = value of [z], [7:4] = value of [y] |
| Vdm3 (min disturb) | Expressed as [y]exp[z] [3:0] = value of [z], [7:4] = value of [y] |
| Vdm3 (max disturb) | Expressed as [y]exp[z] [3:0] = value of [z], [7:4] = value of [y] |
| Vdm4 (min disturb) | Expressed as [y]exp[z] [3:0] = value of [z], [7:4] = value of [y] |
| Vdm4 (max disturb) | Expressed as [y]exp[z] [3:0] = value of [z], [7:4] = value of [y] |

Thus, for an 8-bit storage location, for example, the [z] value can be stored at bits 0-3, and the [y] value can be stored at bits 4-7. The storage location can be any controller-accessible memory location capable of storing the number of disturb values. In one example, the storage location can be a memory register at the memory controller. In another example, the storage location can be at the NVM.

In another example embodiment, as is shown in FIG. 4c, a disturb-based drift compensation scheme can include 422 determining or retrieving the disturb number subranges, as described above. At operation 424, an I/O request is received by the controller, and 426 a determination is made as to whether or not the I/O request is a read operation or a write operation. If the I/O request is not a read or a write operation, control is passed back to operation 424, and the controller waits to receive another I/O operation. If, however, the I/O request is a read or a write operation, control passes to 428 and the drift compensation circuitry 314 determines the number of disturbs since the last write operation to the memory cell associated with the physical address to which the read or write operation is directed, or in other words, since Vt was reset by a write operation. It is noted that, in some embodiments, 422 determining the disturb number subranges can occur prior to operation 424 as shown, or during or following operation 424.

At operation 430, the drift compensation circuitry 314 determines a compensated Vdm based, at least in part, on the number of disturbs since the last write operation to the memory cell. In some embodiments, the compensated Vdm can be determined by matching the number of disturbs to one of the disturb number subranges, and then utilizing the compensated Vdm associated with matched subrange. As one example, a memory cell having 4,500 disturbs since the last write event would fall within the $1e^3$ to $1e^4$ disturb range of the $Dist\#2_{MIN} \ldots Dist\#2_{MAX}$ subrange described above. As such, the compensated Vdm associated with this subrange would be used to read or write to the memory cell. A disturb can include any disturbance that can cause drift of Vt in a memory cell, such as read operations to the memory cell, as well as disturbances to nearby memory cells such as write operations.

At operation 432, the controller performs the read or write operation on the memory cell associated with physical address to which the read or write operation is directed, using the compensated Vdm as the Vdm in order to distinguish between the set cells and the reset cells. For a read operation, the compensated Vdm has been shifted relative to the original Vdm to account for the drift of Vt. For a write operation, a programming pulse can be sent to the memory cell, where the programming pulse has a voltage that is higher than the compensated Vdm to ensure that the programming pulse causes a Vt shift and melts phase change material in the memory cell, which would reset the Vt of the memory cell to its program state value.

In one example embodiment, the compensated Vdm obtained from the matched subrange described above (as well as an uncompensated Vdm), while in another embodiment, an instruction used to generate the compensated Vdm, can be sent from a memory controller to memory as part of the command sequence for read and write operations, in some cases for read or write operations. In one specific example, two bits are reserved in command operations as is shown in Table 3. Thus, by tracking the Vt drift of a memory cell or cells, the values of Vdm used for read and write operations can more closely reflect an actual demarcation point that can be used to differentiate set memory cells from reset memory cells, regardless of the rate or degree of drift that has occurred. By sending drift-compensated voltage values for Vdm or instructions to generate Vdm (i.e. an indication of which Vdm to use) with the command sequence for read and/or write operations, the system quickly responds to drift as it occurs via a command sequence update of the actual Vdm used in the demarcation operation.

In one embodiment, using Table 3 with the four subrange examples described above, bits VDM1 and VDM2 convey, as part of the command sequence to the memory, which subrange (i.e. subrange01, subrange02, subrange03, subrange04) is indicative of the degree of drift of a memory cell at the time of the read or write operation. For example, if a memory cell has drifted into the third subrange, the command sequence would transmit subrange03 to the memory. The memory receives the command sequence for the read or write operation, and utilizes the associated subrange03 information to modify the Vdm value used in the operation. In this case, subrange 03 would be associated with Vdm3, and the memory would use a value for Vdm3 stored at the memory, or would modify a Vdm value stored at memory with a modification factor associated with Vdm3 to generate the proper Vdm3 corresponding to the degree of drift. For example, if the third subrange corresponds to a compensated Vdm voltage of 4.5V, the command sequence would include subrange03, and a memory-stored value of 4.5V corresponding to subrange03 would be retrieved and used as Vdm for the operation. Alternatively, a modification factor associated with subrange03 and stored in the memory can be retrieved and applied to an initial Vdm to generate the Vdm3 value of 4.5V.

TABLE 3

Command Address Format for 5-CA pin with 8-Cycles

| CA pin | Command Address Cycle | | | | | | | |
|---|---|---|---|---|---|---|---|---|
| | 0 | 1 | 2 | 3 | 4 | 5 | 6 | 7 |
| 4 | CMD3 | RFU | VDM1 | MA | MA | MA | MA | MA |
| 3 | CMD2 | PA3 | VDM0 | MA | MA | MA | MA | MA |
| 2 | CMD1 | PA2 | RFU | MA | MA | MA | MA | MA |
| 1 | CMD0 | PA1 | RFU | MA | MA | MA | MA | MA |
| 0 | RFU | PA0 | MA | MA | MA | MA | MA | MA |

CMD - Command bits
VDM - Demarcation voltage bits
PA - Partition address selects 1 out of the 16 partitions inside the S15 core
MA - Memory addresses bits to access at a granularity of 16B
RFU - Reserved bits for future use Although use of two bits (VDM0 and 1) has been shown to select a subrange, more or fewer bits can be used depending at least on the number of subranges.

Figure 5:
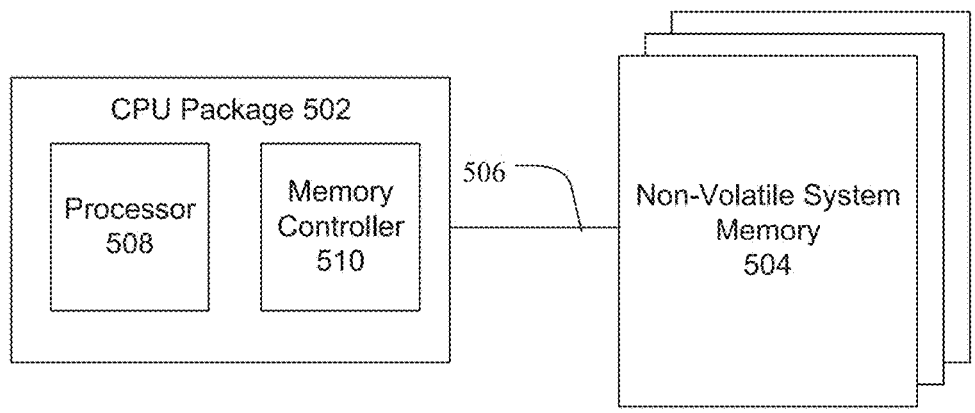
FIG. 5 is a block diagram of a computing system.

As has been described, various structures, devices, systems, and the like, can be realized in a variety of non-limiting implementations. As is shown in FIG. 5, for example, a system can comprise a central processing unit (CPU) package 502 coupled to non-volatile system memory 504 via an internal bus 506. The CPU package 502 comprises a processor 508 and an integrated memory controller 510. The processor 508 can be any number of processors, and can be a central processing unit, an embedded processor, a partitioned processor, a multicore processor, or the like.

The non-volatile system memory 504 can include any type of NVM that may experience drifting of Vt as a result of use or the passage of time. Additionally, in one embodiment a NVM device can comprise a block addressable mode memory device, such as NAND or NOR technologies, or more specifically, multi-threshold level NAND flash memory, NOR flash memory, and the like. A memory device can also include a byte-addressable three dimensional cross point memory device, or other byte addressable write-in-place nonvolatile memory devices, such as single or multi-level PCM, memory devices that use chalcogenide phase change material (e.g., chalcogenide glass), resistive memory, nanowire-based NVM, ferroelectric transistor random access memory (FeTRAM), magnetoresistive random access memory (MRAM) that incorporates memristor technology, spin transfer torque random access memory (STT)-MRAM, and the like, including combinations thereof. In some examples, the non-volatile system memory can be configured to have a dual in-line memory module (DIMM) architecture.

Figure 6:
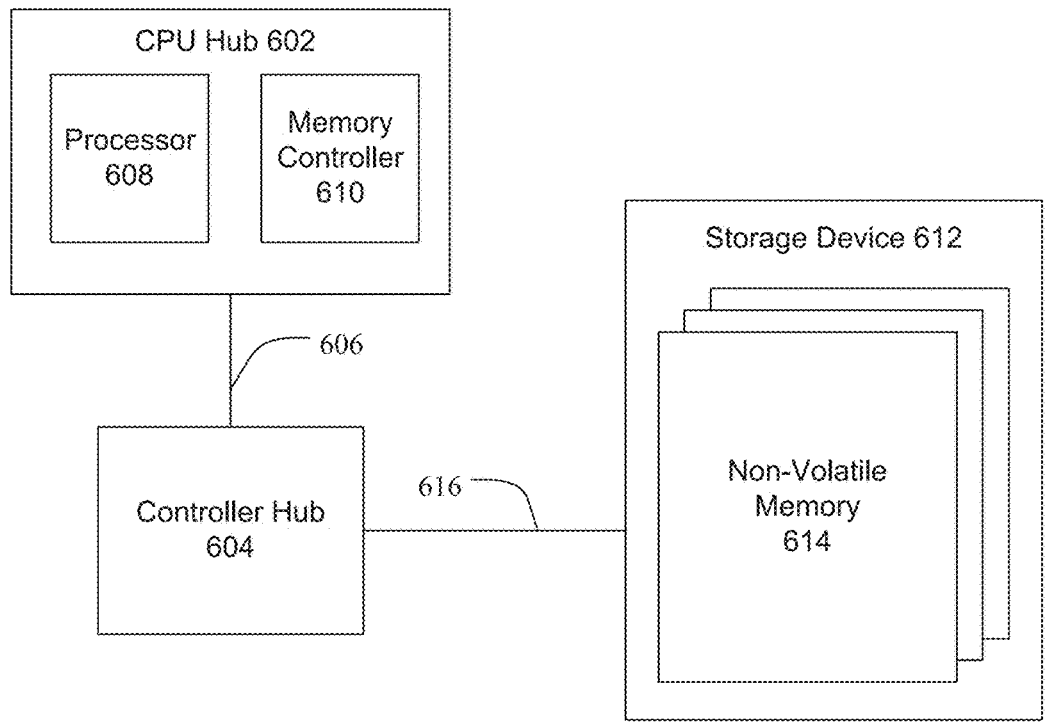
FIG. 6 is a block diagram of a computing system.

In another example embodiment, as is shown in FIG. 6, a system can comprise a CPU package 602 coupled to a controller hub 604 via an internal bus 606. The controller hub 604 can include any type of controller hub, controller device, chipset, or the like, that is distinct from the CPU package 602. The CPU package 602 comprises a processor 608 and an integrated memory controller 610. The processor 608 can be any number of processors, and can be a central processing unit, an embedded processor, a partitioned processor, a multicore processor, or the like. The system further comprises a NVM storage device 612 coupled to the controller hub 604 via an external or communication bus 616.

The NVM storage device further comprises NVM 614, which can include any type of NVM that may experience drifting of Vt as a result of use or the passage of time, and that can be used in a memory storage device. In one embodiment a NVM device can comprise a block addressable mode memory device, such as NAND or NOR technologies, or more specifically, multi-threshold level NAND flash memory, NOR flash memory, and the like. A memory device can also include a byte-addressable three dimensional cross point memory device, or other byte addressable write-in-place nonvolatile memory devices, such as single or multi-level PCM, memory devices that use chalcogenide phase change material, resistive memory, nanowire-based NVM, FeTRAM, MRAM that incorporates memristor technology, STT-MRAM, and the like, including combinations thereof. In some examples, the NVM storage device can include a controller that couples to the controller hub 604 when in use.

The external bus 616 can comprise any type of bus capable of communicating with a storage device. Non-limiting examples of such include Serial Advanced Technology Attachment (SATA) specifications, PCI Express PCIE interfaces, non-volatile media express (NVMe) interfaces, memory high speed interfaces, or the like.

Although not depicted, any system can include and use a power supply such as but not limited to a battery, AC-DC converter at least to receive alternating current and supply direct current, renewable energy source (e.g., solar power or motion based power), or the like.

Figure 7:
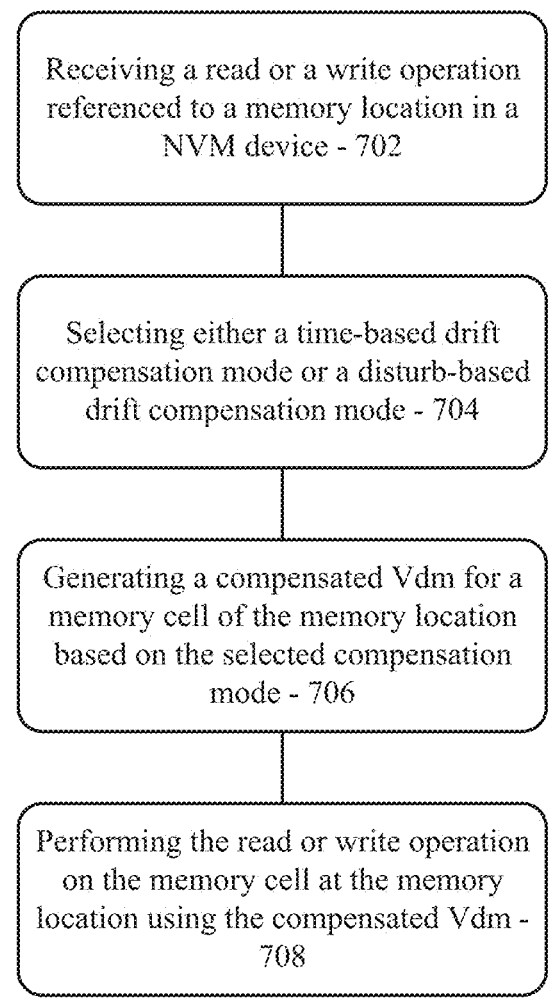
FIG. 7 is a diagram of example method steps.

In another embodiment, a method, which in some cases can be a computer-implemented method, is provided. As is shown in FIG. 7, such a method can comprise 702 receiving, from a controller, a read or a write operation referenced to a memory location in a NVM device, 704 selecting, as a compensation mode, either a time-based drift compensation mode or a disturb-based drift compensation mode, 706 generating a compensated demarcation voltage (Vdm) for a memory cell of the memory location based on the selected compensation mode, and 708 performing the read or write operation on the memory cell at the memory location using the compensated Vdm.

In various examples, the operations discussed herein, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

EXAMPLES

The following examples pertain to specific embodiments and point out specific features, elements, or steps that can be used or otherwise combined in achieving such embodiments.

In one example there is provided a memory controller, comprising circuitry configured to:

obtain a compensated demarcation voltage (Vdm) by either a time-based drift compensation mode or a disturb-based drift compensation mode; and apply the compensated Vdm to a memory cell of a memory location of a non-volatile memory (NVM) device.

In one example of a memory controller, in order to obtain the compensated Vdm by the time-based drift compensation mode, the circuitry is further configured to:

receive a read or a write operation referenced to the memory location;

determine a time elapsed since a last write operation to the memory cell of the memory location; and determine the compensated Vdm using the time elapsed.

In one example of a memory controller, in order to determine the compensated Vdm, the circuitry is further configured to:

compare the time elapsed to a plurality of elapsed time subranges correlated with a plurality of potential compensated Vdms;

select an elapsed time subrange from the plurality of elapsed time subranges that includes the time elapsed; and identify the potential compensated Vdm associated with the selected elapsed time subrange as the compensated Vdms.

In one example of a memory controller, in order to obtain the compensated Vdm by the disturb-based drift compensation mode, the circuitry is further configured to:

receive a read or a write operation referenced to the memory location;

determine a number of disturbs to the memory cell since a last write to the memory cell; and determine the compensated Vdm using the number of disturbs.

In one example of a memory controller, in order to determine the compensated Vdm, the circuitry is further configured to:

compare the number of disturbs to a plurality of disturb number subranges correlated with a plurality of potential compensated Vdms;

select a disturb number subrange from the plurality of disturb number subranges that includes the number of disturbances to the memory cell; and identify the potential compensated Vdm associated with the selected disturb number subrange as the compensated Vdms.

In one example of a memory controller, the number of disturbs comprises a number of read operations to the memory cell.

In one example of a memory controller, the circuitry further comprises:

a mode indicator configured to specify whether the compensated Vdm is obtained according to the time-based drift compensation mode or the disturb-based drift compensation mode.

In one example of a memory controller, the mode indicator is a mode bit.

In one example of a memory controller, the memory cell is a phase change memory (PCM) cell.

In one example of a memory controller, the NVM device includes a three-dimensional (3D) cross-point array.

In one example there is provided a computation system, comprising:

At least one processor;

a non-volatile memory (NVM) device comprising an array of memory cells; and a controller coupled to the NVM device and the at least one processor, the controller further comprising circuitry configured to:

determine whether a compensated demarcation voltage (Vdm) is to be obtained according to a time-based drift compensation mode or a disturb-based drift compensation mode;

obtain the compensated Vdm according to the determined mode; and apply the compensated Vdm to a memory cell of a memory location of the array of memory cells.

In one example of a computation system, the system further comprises a mode indicator coupled to the controller and configured to specify whether the compensated Vdm is obtained according to the time-based drift compensation mode or the disturb-based drift compensation mode.

In one example of a computation system, in order to obtain the compensated Vdm by the time-based drift compensation mode, the circuitry is further configured to:

receive a read or a write operation referenced to the memory location;

determine a time elapsed since a last write operation to the memory cell of the memory location; and determine the compensated Vdm using the time elapsed.

In one example of a computation system, in order to determine the compensated Vdm, the circuitry is further configured to:

compare the time elapsed to a plurality of elapsed time subranges correlated with a plurality of potential compensated Vdms;

select an elapsed time subrange from the plurality of elapsed time subranges that includes the time elapsed; and identify the potential compensated Vdm associated with the selected elapsed time subrange as the compensated Vdms.

In one example of a computation system, in order to obtain the compensated Vdm by the disturb-based drift compensation mode, the circuitry is further configured to:

receive a read or a write operation referenced to the memory location;

determine a number of disturbs to the memory cell since a last write to the memory cell; and determine the compensated Vdm using the number of disturbs.

In one example of a computation system, in order to determine the compensated Vdm, the circuitry is further configured to:

compare the number of disturbs to a plurality of disturb number subranges correlated with a plurality of potential compensated Vdms;

select a disturb number subrange from the plurality of disturb number subranges that includes the number of disturbs to the memory cell; and identify the potential compensated Vdm associated with the selected disturb number subrange as the compensated Vdms.

In one example of a computation system, the memory cells include phase change memory cells (PCM).

In one example of a computation system, the array of PCM cells is configured as a three-dimensional (3D) cross-point array.

In one example of a computation system, the system further comprises one or more of a network interface communicatively coupled to the at least one processor, a display communicatively coupled to the at least one processor, or a power supply communicatively coupled to the at least one processor.

In one example there is provided, a computer-implemented method, comprising:

receiving, from a controller, a read or a write operation referenced to a memory location in a non-volatile memory (NVM) device;

selecting, as a compensation mode, either a time-based drift compensation mode or a disturb-based drift compensation mode;

generating a compensated demarcation voltage (Vdm) for a memory cell of the memory location based on the selected compensation mode; and performing the read or write operation on the memory cell at the memory location using the compensated Vdm.

In one example of a computer-implemented method, selecting, as the compensation mode, either the time-based drift compensation mode or the disturb-based drift compensation mode, further comprises:

determining a number of disturbs to the memory cell since a last write operation to the memory cell; and selecting, using the number of disturbs, either the time-based drift compensation mode or the disturb-based drift compensation mode.

In one example of a computer-implemented method, the number of disturbs comprises a number of read operations to the memory cell.

In one example of a computer-implemented method, the method further comprises:

selecting, as the compensation mode, the time-based drift compensation mode;

determining a time elapsed since a last write operation to the memory cell of the memory location; and determining the compensated Vdm using the time elapsed.

In one example of a computer-implemented method, in order to determine the compensated Vdm, the method further comprises:

comparing the time elapsed to a plurality of elapsed time subranges correlated with a plurality of potential compensated Vdms;

selecting an elapsed time subrange from the plurality of elapsed time subranges that includes the time elapsed; and identifying the potential compensated Vdm associated with the selected elapsed time subrange as the compensated Vdms.

In one example of a computer-implemented method, the method further comprises:

selecting, as the compensation mode, the disturb-based drift compensation mode;

determining a number of disturbs to the memory cell since a last write to the memory cell; and determining the compensated Vdm using the number of disturbs.

In one example of a computer-implemented method, in order to determine the compensated Vdm, the method further comprises:

comparing the number of disturbs to a plurality of disturb number subranges correlated with a plurality of potential compensated Vdms;

selecting a disturb number subrange from the plurality of disturb number subranges that includes the number of disturbs to the memory cell; and identifying the potential compensated Vdm associated with the selected disturb number subrange as the compensated Vdms.

While the forgoing examples are illustrative of the principles of embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory controller, comprising circuitry configured to:

receive an input/output (I/O) request referenced to a memory location of a non-volatile memory (NVM) device;

obtain a compensated demarcation voltage (Vdm) by either a time-based drift compensation mode or a disturb-based drift compensation mode;

determine if the I/O request is a read request or a write request;

if the I/O request is a read request, apply the compensated Vdm to a memory cell of the memory location; and if the I/O request is a write request, apply a programming pulse to a memory cell of the memory location, the programming pulse having a voltage greater than the compensated Vdm.

2. The memory controller of claim 1, wherein to obtain the compensated Vdm by the time-based drift compensation mode, the circuitry is further configured to:

determine a time elapsed since a last write operation to the memory cell of the memory location; and determine the compensated Vdm using the time elapsed.

3. The memory controller of claim 2, wherein to determine the compensated Vdm, the circuitry is further configured to:

compare the time elapsed to a plurality of elapsed time subranges correlated with a plurality of potential compensated Vdms;

select an elapsed time subrange from the plurality of elapsed time subranges that includes the time elapsed; and identify the potential compensated Vdm associated with the selected elapsed time subrange as the compensated Vdms.

4. The memory controller of claim 1, wherein to obtain the compensated Vdm by the disturb-based drift compensation mode, the circuitry is further configured to:

receive a read or a write operation referenced to the memory location;

determine a number of disturbs to the memory cell since a last write to the memory cell; and determine the compensated Vdm using the number of disturbs.

5. The memory controller of claim 4, wherein to determine the compensated Vdm, the circuitry is further configured to:

compare the number of disturbs to a plurality of disturb number subranges correlated with a plurality of potential compensated Vdms;

select a disturb number subrange from the plurality of disturb number subranges that includes the number of disturbances to the memory cell; and identify the potential compensated Vdm associated with the selected disturb number subrange as the compensated Vdms.

6. The memory controller of claim 4, wherein the number of disturbs comprises a number of read operations to the memory cell.

7. The memory controller of claim 1, wherein the circuitry further comprises:

a mode indicator configured to specify whether the compensated Vdm is obtained according to the time-based drift compensation mode or the disturb-based drift compensation mode.

8. The memory controller of claim 7, wherein the mode indicator is a mode bit.

9. The memory controller of claim 7, wherein the memory cell comprises a phase change memory (PCM) cell.

10. The memory controller of claim 1, wherein the NVM device comprises a three-dimensional (3D) cross-point array.

11. A memory computation system, comprising:
at least one processor;
a non-volatile memory (NVM) device comprising an array of memory cells; and
a controller coupled to the NVM device and the at least one processor, the controller further comprising circuitry configured to:
receive an input/output (I/O) request referenced to a memory location of the NVM device;
determine whether a compensated demarcation voltage (Vdm) is to be obtained according to a time-based drift compensation mode or a disturb-based drift compensation mode;
obtain the compensated Vdm according to the determined mode;
determine if the I/O request is a read request or a write request;
if the I/O request is a read request, apply the compensated Vdm to a memory cell of the memory location of the array of memory cells; and
if the I/O request is a write request, apply a programming pulse to a memory cell of the memory location, the programming pulse having a voltage greater than the compensated Vdm.

12. The computation system of claim 11, further comprising a mode indicator coupled to the controller and configured to specify whether the compensated Vdm is obtained according to the time-based drift compensation mode or the disturb-based drift compensation mode.

13. The computation system of claim 11, wherein to obtain the compensated Vdm by the time-based drift compensation mode, the circuitry is further configured to:
receive a read or a write operation referenced to the memory location;
determine a time elapsed since a last write operation to the memory cell of the memory location; and
determine the compensated Vdm using the time elapsed.

14. The computation system of claim 13, wherein to determine the compensated Vdm, the circuitry is further configured to:
compare the time elapsed to a plurality of elapsed time subranges correlated with a plurality of potential compensated Vdms;
select an elapsed time subrange from the plurality of elapsed time subranges that includes the time elapsed; and
identify the potential compensated Vdm associated with the selected elapsed time subrange as the compensated Vdms.

15. The computation system of claim 11, wherein to obtain the compensated Vdm by the disturb-based drift compensation mode, the circuitry is further configured to:
receive a read or a write operation referenced to the memory location;
determine a number of disturbs to the memory cell since a last write to the memory cell; and
determine the compensated Vdm using the number of disturbs.

16. The computation system of claim 15, wherein to determine the compensated Vdm, the circuitry is further configured to:
compare the number of disturbs to a plurality of disturb number subranges correlated with a plurality of potential compensated Vdms;
select a disturb number subrange from the plurality of disturb number subranges that includes the number of disturbs to the memory cell; and
identify the potential compensated Vdm associated with the selected disturb number subrange as the compensated Vdms.

17. The computation system of claim 11, wherein the array of memory cells includes an array of phase change memory (PCM) cells.

18. The computation system of claim 17, wherein the array of PCM cells is configured as a three-dimensional (3D) cross-point array.

19. The computation system of claim 11, further comprising one or more of:
a network interface communicatively coupled to the at least one processor;
a display communicatively coupled to the at least one processor; or
a power supply communicatively coupled to the at least one processor.

* * * * *